United States Patent [19]
Molnar et al.

[11] Patent Number: 5,912,929
[45] Date of Patent: Jun. 15, 1999

[54] METHOD AND APPARATUS FOR PERFORMING CARRIER DETECTION

[75] Inventors: Richard J. Molnar, Mentor; Joseph C. Nemer, Mayfield Heights, both of Ohio

[73] Assignee: Elsag International N.V., Amsterdam, Netherlands

[21] Appl. No.: 08/827,162

[22] Filed: Mar. 27, 1997

[51] Int. Cl.[6] .......................... H04L 27/14; H04L 27/16; H04L 27/22

[52] U.S. Cl. .................. 375/326; 329/323; 329/345; 329/346; 329/358; 329/361

[58] Field of Search ............... 375/326; 329/323, 329/346, 358, 361, 345

[56] References Cited

U.S. PATENT DOCUMENTS

| | | | |
|---|---|---|---|
| 4,639,680 | 1/1987 | Nelson | 327/7 |
| 4,749,960 | 6/1988 | Mower et al. | 331/4 |
| 5,563,914 | 10/1996 | Sogabe | 375/326 |
| 5,739,768 | 4/1998 | Lane et al. | 340/933 |

*Primary Examiner*—Stephen Chin
*Assistant Examiner*—Michael W. Maddox
*Attorney, Agent, or Firm*—Michael M. Rickin

[57] ABSTRACT

A digital implementation for a carrier detector. The detector determines if the carrier frequency at any instant is within a predetermined frequency band. The detector further determines if the detected frequency remains within the predetermined frequency band for a predetermined period of time. The detector also provides an indication that there has not been any loss of carrier for another predetermined period of time.

6 Claims, 2 Drawing Sheets

_5,912,929_

METHOD AND APPARATUS FOR PERFORMING CARRIER DETECTION

FIELD OF THE INVENTION

This invention relates to industrial control communication applications and more particularly to a digital implementation for detecting a carrier frequency used in such applications.

DESCRIPTION OF THE PRIOR ART

The detectors of the prior art typically use some type of analog means for detecting a carrier frequency. One such prior art implementation is the bandpass filter 26 of FIG. 1. Filter 26 includes resistors 11, 12, and 18; capacitors 14, 17, and operational amplifier 16. In response to an input frequency signal, filter 26 provides a binary level output signal 20.

The output signal 20 can, if it is necessary to have that signal in a binary digital format, be processed by the analog to digital translation circuit 27 shown in FIG. 1. Circuit 27 consists of a comparator 22 and a level shifting type inverter 24. The output signal 25 of circuit 27 will be a pulse train when the carrier frequency is in range.

It is desired to have a steady binary level output to indicate carrier detection. That output can be obtained by either connecting an additional digital rectifier and/or filter at output 25 and/or adding, as is shown in FIG. 1, an analog rectifier circuit 28 to the circuit 26, 27. Circuit 28 can be embodied by a diode in combination with an RC circuit.

Other prior art embodiments for carrier detectors require much more complicated phase comparators and other circuit elements. This, in turn, requires more circuitry and/or power consumption as well as external discrete components such as resistors and capacitors. In contrast, the present invention permits a simple digital implementation that makes it attractive to discrete digital and gate array or application specific integrated circuit (ASIC) low power applications. The prior art embodiments usually include various analog and high power consuming techniques which detect carrier frequencies; however, analog techniques utilize more real estate especially when put into an ASIC. Hence, there are drawbacks to implementing carrier techniques in an analog form or a complex digital form.

An apparatus for detecting the carrier frequency of a digital information signal that has a predetermined time duration. The apparatus has a carrier in range circuit that responds to the digital information signal to provide a first signal with a first amplitude when the carrier frequency is within a predetermined carrier frequency band and a second amplitude when the carrier frequency is outside of the predetermined carrier frequency band.

The apparatus also has a carrier detected circuit that responds to the first amplitude of the first signal and a clock signal to provide a second signal that has a first amplitude indicative that the carrier frequency is detected only if the carrier frequency remains within the predetermined carrier frequency band for a first predetermined period of time that is within the digital information signal predetermined time duration. The carrier detected circuit responds to the second amplitude of the first signal to provide the second signal with a second amplitude indicative that the carrier frequency is outside of the predetermined carrier frequency band.

The apparatus further has a circuit that responds to the second signal first amplitude to provide a carrier stable signal which has a first amplitude indicative of no loss of the detected carrier frequency during the digital information signal predetermined time duration. This circuit responds to the second signal second amplitude occurring during the digital information signal predetermined time duration to provide the carrier stable signal with a second amplitude indicative that the detected carrier frequency was lost during the digital information signal predetermined time duration. This circuit retains the occurrence of the carrier stable signal second amplitude during the digital information signal predetermined time duration even if the second signal returns to the first amplitude during that duration.

A method for detecting the carrier frequency of a digital information signal that has a predetermined time duration. The method has the step of generating in response to the digital information signal a first signal having a first amplitude when the carrier frequency is within a predetermined carrier frequency band and a second amplitude when the carrier frequency is outside of the predetermined carrier frequency band.

The method further has the step of generating in response to the first amplitude of the first signal and a clock signal, only if the carrier frequency remains within the predetermined carrier frequency band for a first predetermined period of time that is within the digital information signal predetermined time duration, a second signal having a first amplitude indicative that the carrier frequency is detected and generating in response to the second amplitude of the first signal the second signal with a second amplitude indicative that the carrier frequency is outside of the predetermined carrier frequency band.

The method also has the step of providing in response to the second signal first amplitude a carrier stable signal having an amplitude indicative of no loss of the detected carrier frequency during the digital information signal predetermined time duration and providing in response to the second signal second amplitude occurring during the digital information signal predetermined time duration the carrier stable signal with a second amplitude indicative that the detected carrier frequency was lost during the digital information signal predetermined time duration.

The method also has the further step of retaining the occurrence of the carrier stable signal second amplitude during the digital information signal predetermined time duration even if the second signal returns to the first amplitude during the digital information signal predetermined time duration.

A method for detecting the carrier frequency of an analog message signal having a predetermined time duration. This method has all of the steps described above and before the execution of those steps has the step of converting the analog information signal into a digital information signal having the predetermined time duration.

An apparatus for detecting the carrier frequency of a digital signal. The apparatus has a carrier in range circuit. That circuit has an exclusive OR gate for comparing the phase of the digital signal with the phase of a signal from a voltage controlled oscillator to provide a phase error signal at the output of the exclusive OR gate.

The apparatus also has a "D" type flip-flop that has a D input for receiving the phase error signal. The flip-flop responds to the phase error signal and a signal derived from the digital signal for providing a first signal having a first amplitude when the carrier frequency is within a predetermined carrier frequency band and a second amplitude when the carrier frequency is outside of the predetermined carrier frequency band.

A method for indicating the stability of the carrier frequency of a digital information signal having a predetermined time duration. The method has the step of providing a first signal with a first amplitude indicative that the carrier frequency is detected when the carrier frequency is within a predetermined carrier frequency band for a predetermined period of time within the digital information signal predetermined time duration and a second amplitude when the carrier frequency falls outside of the predetermined carrier frequency carrier band during the digital information signal predetermined time duration.

The method also has the step of providing in response to the first signal first amplitude a carrier stable signal having an amplitude indicative of no loss of the detected carrier frequency during the digital information signal predetermined time duration. The method has the further step of providing in response to the first signal second amplitude the carrier stable signal with a second amplitude indicative that the detected carrier frequency was lost during the digital information signal predetermined time duration. The method also has the further step of retaining the occurrence of the carrier stable signal second amplitude during the digital information signal predetermined time duration even if the first signal returns to the first amplitude during the digital information signal predetermined time duration.

DESCRIPTION OF THE PREFERRED EMBODIMENT(S)

Figure 1:
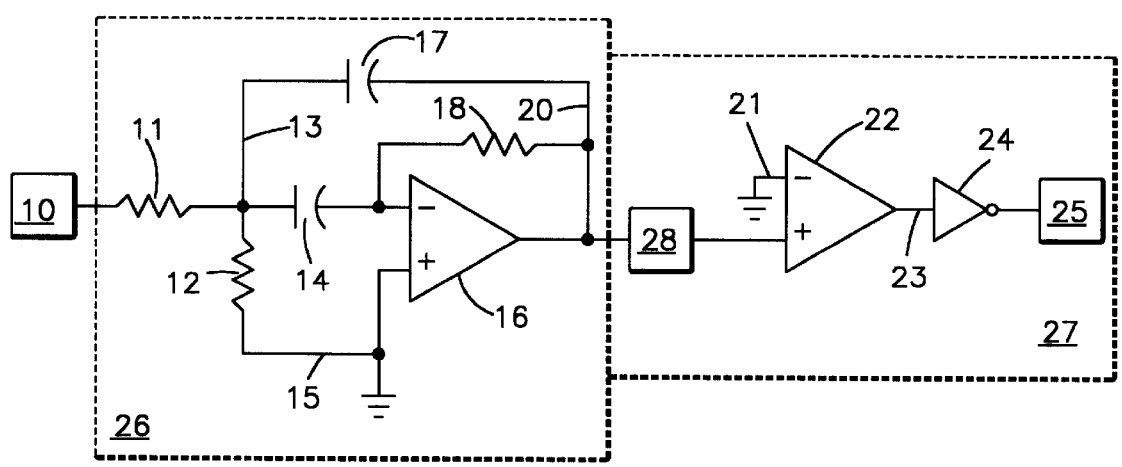
FIG. 1 shows a block diagram for a prior art embodiment of a carrier detection circuit.
Figure 2:
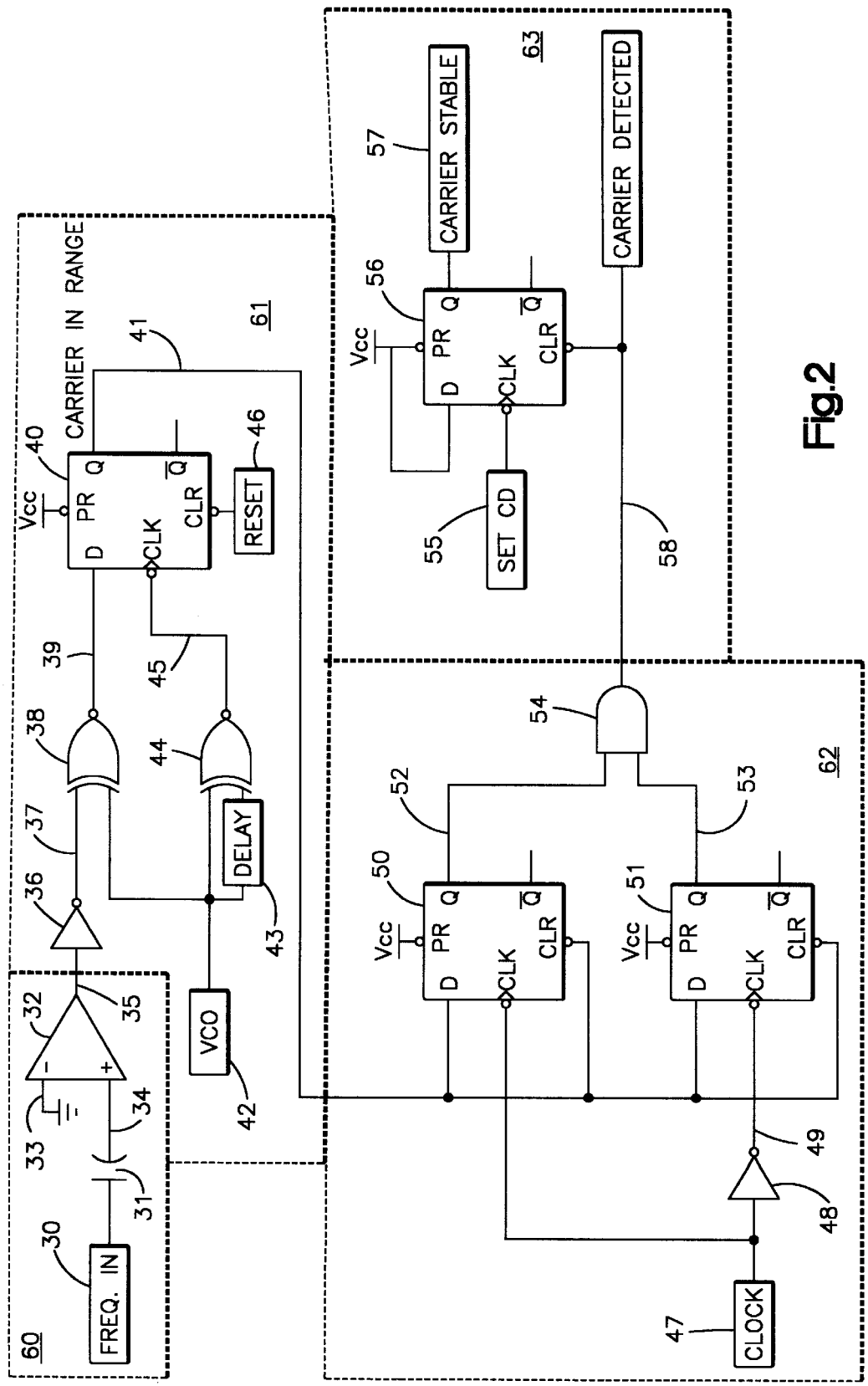
FIG. 2 shows one embodiment for the carrier detection circuit of the present invention.

Referring now to FIG. 2, there is shown one embodiment for the digital implementation of a carrier detection circuit in accordance with the present invention. The embodiment is divided into four circuits 60, 61, 62 and 63, each of which has an associated function. Circuit 60 transfers the analog input frequency signal 30 into a signal 35 having a digital format. Circuit 61 generates an instantaneous signal 41 which is indicative of whether or not the input frequency signal 30 is within a predetermined carrier frequency band. Circuit 62 provides an output signal 58 which is indicative of the input signal carrier frequency only if that carrier frequency remains within the predetermined band or range for a predetermined period of time. Circuit 63 provides an output signal 57 which is indicative of no loss of input signal carrier frequency over a predetermined period of time. Each of the circuits 60–63 will be described in more detail below.

It is necessary to interface the input signal 30 that has the carrier frequency to be detected to the digital circuitry and various techniques may be used to achieve the interface. One such technique will be described utilizing the circuitry in 60. Capacitor 31 AC couples the input signal 30 so that only signals with frequency content can toggle the output 35 of the comparator 32.

The output of the comparator 32 is fed to the input of circuitry 61. It is useful to the user to have an instantaneous indication of whether or not the carrier frequency of input signal 30 is within the predetermined carrier frequency range. This is the function of circuitry 61 which provides at its output the Carrier in Range signal 41.

The output of comparator 32 is fed into an inverter 36 of circuitry 61. Inverter 36 may include level shifting properties, for example shifting a binary level +5V/–5V signal at its input to a 0V/+5V signal 37 at its output. The phase of the signal 37 is compared with the phase of the signal from a voltage controlled oscillator ("VCO") 42 using an exclusive-OR gate 38. The phase error output signal 39 of gate 38 is fed into the data "D" input of D-type flip flop 40. The Q or non-inverted output 41 of the flip-flop 40 is the Carrier in Range signal.

The Carrier in Range signal 41 is connected to the data "D", and clear "CLR" inputs of flip-flops 50 and 51 which along with an inverter 48 and an "AND" gate 54 are included in circuitry 62. A clock signal 47 is used to update the status of the flip-flops 50 and 51. The rising edge of the clock signal 47 clocks flip-flop 50. The clock signal 47 passes through inverter 48 to thereby allow the falling edge of the clock signal 47 to clock flip-flop 51 with signal 49 at the output of the inverter 48. Therefore, inverter 48 allows the Carrier in Range signal to be sampled on both phases of clock signal 47.

The outputs 52 and 53 of flip-flops 50 and 51 are inputs to two input "AND" gate 54. The output signal 58 of the "AND" gate 54 is the Carrier Detected signal 58. It is desirable to indicate that the carrier frequency of the input signal is detected only if that carrier frequency remains within the predetermined carrier frequency range continuously for a predetermined amount of time. This is the function of circuitry 62 as that circuitry indicates if the input signal 30 has been in the predetermined carrier frequency range for at least one full cycle of the clock signal 47.

The clock signal 47 is at a much lower frequency than the carrier frequency being detected. For example, the clock signal frequency could be about one-tenth the carrier frequency of input signal 30.

It is desirable for the equipment receiving the transmission associated with the detected carrier frequency and the user of such equipment to know if during the transmission there was a loss of the carrier frequency. Circuitry 63 can be used to provide that knowledge by using the Carrier Detected signal in the manner described below. The typical transmission may include both information such as a message and a preamble to the message which allows the transmission receiving circuitry to synchronize itself to the transmission prior to demodulating the message.

In response to the Carrier Detected signal, a device such as a microprocessor (not shown) can cause a rising edge to occur on the Set CD signal 55. That signal clocks flip-flop 56 set thereby causing the Q output of the flip-flop and therefore the Carrier Stable signal 57 to go high. If during the course of the transmission the detected carrier frequency should fall out of range, the Carrier Detected signal 58 will go low and reset flip-flop 56. The resetting of the flip-flop will cause the Carrier Stable signal 57 to go low.

If, for example, the microprocessor looks at the Carrier Stable signal 57 at any time prior to the end of the transmission and sees that the signal is low then the microprocessor knows that the received information is not valid. As is well known, the microprocessor can be programmed to provide an output signal which is used to provide to the user of the equipment receiving the transmitted information an indication of the validity or invalidity of the transmission. This function of circuitry 63 is in essence a time stamp which guarantees the user that there was no loss of carrier since the time that the Set CD signal 55 was issued. As is also well known, the microprocessor can be programmed to allow the user of the equipment receiving the transmitted information to determine when the rising edge should occur on the Set CD signal 55 as well as determine when to access the status of the Carrier Stable signal 57 at any time prior to the end of the transmission.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. An apparatus for detecting the carrier frequency of a digital information signal having a predetermined time duration comprising:

a) a carrier in range circuit responsive to said digital information signal for providing a first signal having a first amplitude when said carrier frequency is within a predetermined carrier frequency band and a second amplitude when said carrier frequency is outside of said predetermined carrier frequency band;

b) a carrier detected circuit responsive to said first amplitude of said first signal and a clock signal for providing a second signal having a first amplitude indicative that said carrier frequency is detected only if said carrier frequency remains within said predetermined carrier frequency band for a first predetermined period of time that is within said digital information signal predetermined time duration, said carrier detected circuit responsive to said second amplitude of said first signal for providing said second signal with a second amplitude indicative that said carrier frequency is outside of said predetermined carrier frequency band; and c) a circuit responsive to said second signal first amplitude for providing a carrier stable signal having a first amplitude indicative of no loss of said detected carrier frequency during said digital information signal predetermined time duration, said circuit responsive to said second signal second amplitude occurring during said digital information signal predetermined time duration for providing said carrier stable signal with a second amplitude indicative that said detected carrier frequency was lost during said digital information signal predetermined time duration, said circuit retaining the occurrence of said carrier stable signal second amplitude during said digital information signal predetermined time duration even if said second signal returns to said first amplitude during said digital information signal predetermined time duration.

2. A method for detecting the carrier frequency of a digital information signal having a predetermined time duration comprising the steps of:

a) generating in response to said digital information signal a first signal having a first amplitude when said carrier frequency is within a predetermined carrier frequency band and a second amplitude when said carrier frequency is outside of said predetermined carrier frequency band;

b) generating in response to said first amplitude of said first signal and a clock signal, only if said carrier frequency remains within said predetermined carrier frequency band for a first predetermined period of time that is within said digital information signal predetermined time duration, a second signal having a first amplitude indicative that said carrier frequency is detected and generating in response to said second amplitude of said first signal said second signal with a second amplitude indicative that said carrier frequency is outside of said predetermined carrier frequency band;

c) providing in response to said second signal first amplitude a carrier stable signal having an amplitude indicative of no loss of said detected carrier frequency during said digital information signal predetermined time duration and providing in response to said second signal second amplitude occurring during said digital information signal predetermined time duration said carrier stable signal with a second amplitude indicative that said detected carrier frequency was lost during said digital information signal predetermined time duration; and d) retaining the occurrence of said carrier stable signal second amplitude during said digital information signal predetermined time duration even if said second signal returns to said first amplitude during said digital information signal predetermined time duration.

3. A method for detecting the carrier frequency of an analog message signal having a predetermined time duration comprising the steps of:

a) converting said analog information signal into a digital information signal having said predetermined time duration;

b) generating in response to said digital information signal a first signal having a first amplitude when said carrier frequency is within a predetermined carrier frequency band and a second amplitude when said carrier frequency is outside of said predetermined carrier frequency band;

c) generating in response to said first amplitude of said first signal and a clock signal, only if said carrier frequency remains within said predetermined carrier frequency band for a first predetermined period of time that is within said digital information signal predetermined time duration, a second signal having a first amplitude indicative that said carrier frequency is detected and generating in response to said second amplitude of said first signal said second signal with a second amplitude indicative that said carrier frequency is outside of said predetermined carrier frequency band;

d) providing in response to said second signal first amplitude a carrier stable signal having an amplitude indicative of no loss of said detected carrier frequency during said digital information signal predetermined time duration and providing in response to said second signal second amplitude occurring during said digital information signal predetermined time duration said carrier stable signal with a second amplitude indicative that said detected carrier frequency was lost during said digital information signal predetermined time duration; and e) retaining the occurrence of said carrier stable signal second amplitude during said digital information signal predetermined time duration even if said second signal returns to said first amplitude during said digital information signal predetermined time duration.

4. An apparatus for detecting the carrier frequency of a digital signal comprising:

a carrier in range circuit comprising:
   an exclusive OR gate for comparing the phase of said digital signal with the phase of a signal from a voltage controlled oscillator to provide a phase error signal at the output of said exclusive OR gate; and
   a "D" type flip-flop having a D input for receiving said phase error signal, said flip-flop responsive to said phase error signal and a signal derived from said digital signal for providing a first signal having a first amplitude when said carrier frequency is within a predetermined carrier frequency band and a second amplitude when said carrier frequency is outside of said predetermined carrier frequency band.

5. The apparatus of claim 4 further comprising:

a carrier detected circuit comprising:

first and second "D" type flip-flops each having a D input for receiving said first signal and an output, said first flip-flop of said carrier detected circuit responsive to said first signal first amplitude and a first edge of a clock signal for providing a signal at said first flip-flop output having a first amplitude and said second flip-flop of said carrier detected circuit responsive to said first signal first amplitude and a second edge of said clock signal for providing a signal at said second flip-flop output having said first amplitude; and a two input AND gate having one input connected to said first flip-flop output and the other input connected to said second flip-flop output, said AND gate for providing a second signal having a first amplitude indicative that said carrier frequency is detected only when said first flip-flop output signal has said first flip-flop output signal first amplitude and said second flip-flop output signal has said second flip-flop output signal first amplitude.

6. A method for indicating the stability of the carrier frequency of a digital information signal having a predetermined time duration comprising the steps of:

a) providing a first signal with a first amplitude indicative that said carrier frequency is detected when said carrier frequency is within a predetermined carrier frequency band for a predetermined period of time within said digital information signal predetermined time duration and a second amplitude when said carrier frequency falls outside of said predetermined carrier frequency carrier band during said digital information signal predetermined time duration;

b) providing in response to said first signal first amplitude a carrier stable signal having an amplitude indicative of no loss of said detected carrier frequency during said digital information signal predetermined time duration;

c) providing in response to said first signal second amplitude said carrier stable signal with a second amplitude indicative that said detected carrier frequency was lost during said digital information signal predetermined time duration; and d) retaining the occurrence of said carrier stable signal second amplitude during said digital information signal predetermined time duration even if said first signal returns to said first amplitude during said digital information signal predetermined time duration.

* * * * *